BURIED CHANNEL FIELD EFFECT TRANSISTOR AND METHOD OF FORMING

Filed June 28, 1965

INVENTOR.
JOSEPH M. WELTY
BY
ATTORNEYS 3,378,737

BURIED CHANNEL FIELD EFFECT TRANSISTOR AND METHOD OF FORMING

Joseph M. Welty, Los Altos Hills, Calif., assignor to Teledyne, Inc., Hawthorne, Calif., a corporation of California Filed June 28, 1965, Ser. No. 467,196
2 Claims. (Cl. 317—235)

ABSTRACT OF THE DISCLOSURE

A field effect transistor having a channel which is formed by double diffusion through a single window. Two spaced p-type regions are diffused into an n-type substrate. A first p-type diffusion across the spaced regions forms a saddle where the length of the bottom of the saddle is the effective channel length. A second diffusion with an n-type material over the saddle determines the thickness of the channel.

The present invention is directed to an improved field effect transistor and more particularly to a field effect transistor which includes a channel having accurately controlled dimensions and impurity concentration, and method of forming the same.

In field effect transistors, the most critical area is the channel region where the depletion field controls the flow of carriers between source and drain connections. Ideally, for optimum operation, the ratio of the length of the channel to its thickness is approximately 2:1. With past methods of construction, the impurity concentration of the channel has been lower than desired. Both the dimensions and the impurity concentration affect the high frequency response of the device. Devices of the prior art have been limited as to their high frequency response.

It is a general object of the present invention to provide an improved field effect transistor having high frequency response.

It is another object of the present invention to provide a field effect transistor in which the dimensions of the channel region can be closely controlled.

It is still another object of the present invention to provide a field effect transistor and method in which the channel zone has a relatively high impurity concentration.

It is a further object of the present invention to provide a field effect transistor which has a steeply graded gate junction.

It is still a further object of the present invention to provide a simple and economical method of fabricating field effect transistors.

These and other objects of the invention will become more clearly apparent from the following description taken in conjunction with the accompanying drawing.

Referring to the drawing.

Figures 1, 12, 13, 14, 15:
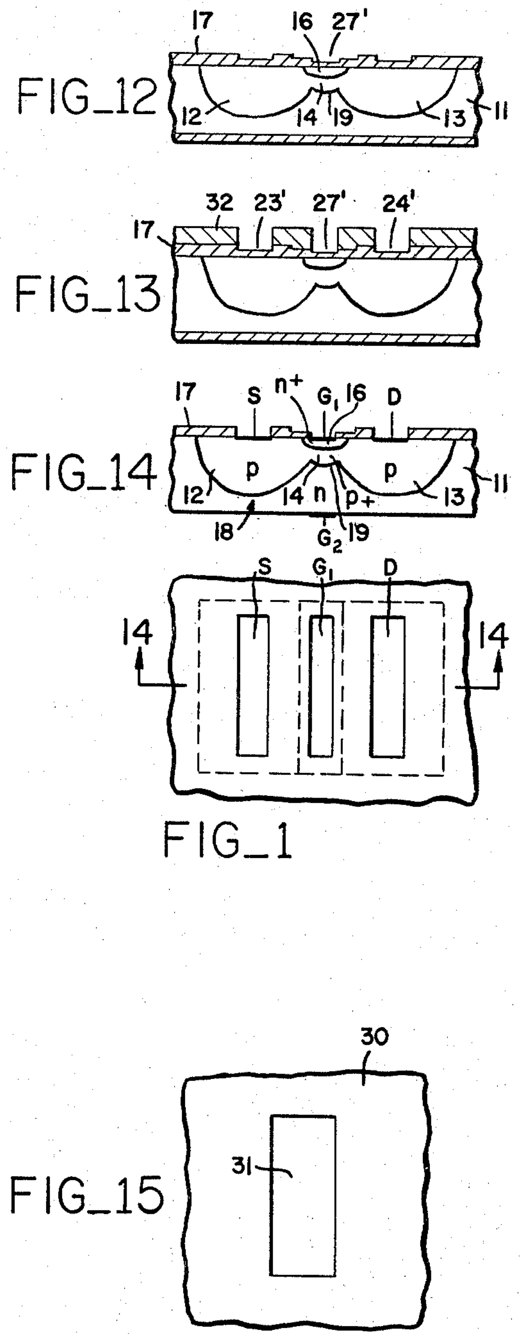
FIGURE 1 is a plan view of a device in accordance with the present invention.
FIGURE 15 shows a plan view of a mask useful in practicing the process of the present invention.

FIGURE 1 shows a complete device, while FIGURES 2–14 are views of a portion of a wafer which might include a large number of devices and which is diced to form individual devices. As best seen in FIGURES 1 and 14, the field effect transistor of the present invention includes a substrate 11 which is formed of semiconductive material of one conductivity type, for example, n-type. Inset into the substrate are zones of semiconductive material which form the various operating regions of the device. The device includes inset spaced source and drain zones 12 and 13 which are connected by a channel 14. An inset gate region 16 provides the rectifying junction through which the depletion layer in the channel is controlled. Ohmic source, gate and drain connections S, $G_1$ and D may be formed with the upper exposed surface of the respective zones. A back gate $G_2$ may also be provided. The ends of the junctions are pacificated by the oxide layer 17.

Referring to the device shown in FIGURES 1 and 14, the substrate may be n-type material, while the diffused inset regions include significant impurities of opposite conductivity type to form spaced p-type source, drain and channel regions. The gate region is of n-type conductivity and forms a rectifying junction with the p-type regions. Preferably, the channel and gate regions have a high impurity concentration designated p+ and n+, respectively.

It is seen that the channel forms a saddle between the spaced source and drain zones. The lower junction 18 which is formed with the substrate has a channel portion 19 which is defined by the intersection of the source and drain portions therewith. The length is determined by the spacing of the diffused source and drain zones and the depth of the channel zone.

The length of the gate junction 21 is substantially greater than the junction portion 19. Therefore, pinch-off occurs when the depletion layer extends to the portion 19, and thus the electrical length of the channel is determined by the length of portion 19. The pinch-off is relatively sharp since the depletion front is substantially parallel at the center of the gate and this meets with a substantially parallel junction portion.

The channel is easily formed with a higher impurity concentration than the source and drain. This gives a steeply graded junction at 19 which provides for narrow and easily controlled space charge regions. In comparison, if the concentration was low, the space charge region would extend a substantial amount and a thicker channel would be required and provide lower frequency response. As will be presently described, the thickness of the channel is controlled by the diffusion schedule. The gate region is also easily formed with high impurity concentration to give a steeply graded junction and again permit formation of a relatively thin channel.

Figures 2, 3, 4, 5, 6, 7, 8, 9, 10, 11:
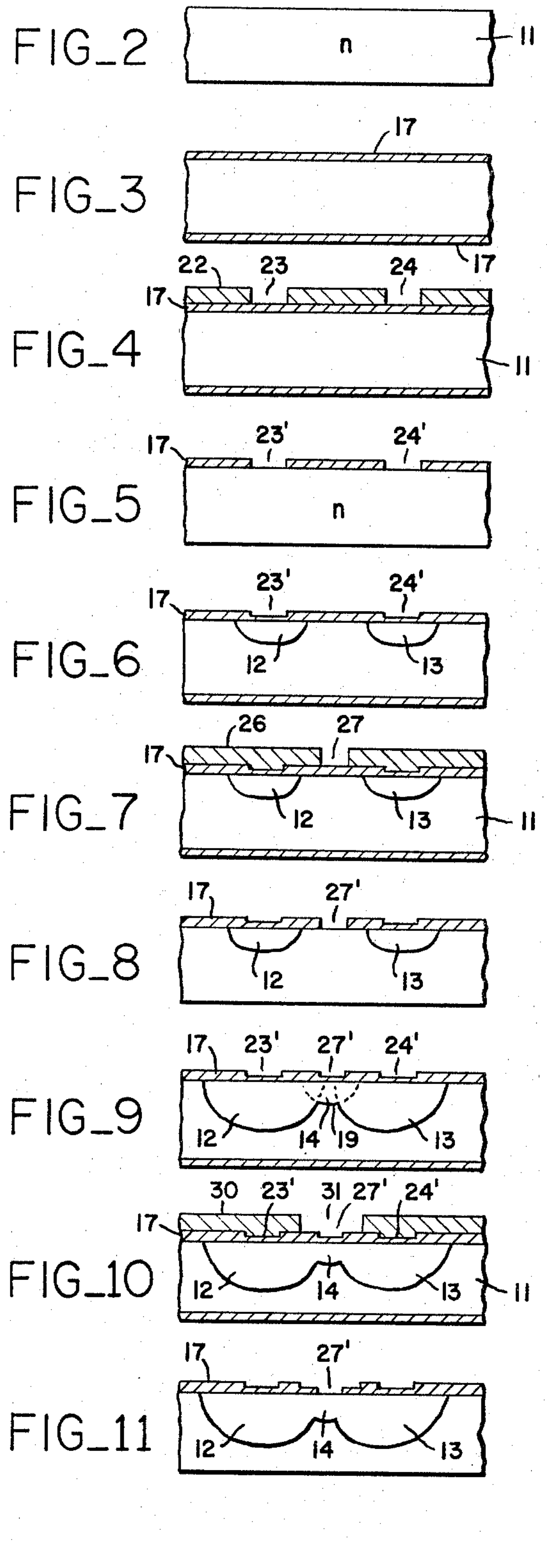
FIGURES 2–14 are partial views showing the steps in the process of making devices of the type shown in FIGURE 1.

Referring now more particularly to FIGURES 2–14, the steps of forming a device in accordance with the invention are illustrated. Initially, a wafer which may be of n-type semiconductive material, FIGURE 2, is lapped to provide a flat upper surface. The wafer is exposed to an oxidizing atmosphere at an elevated temperature to form an oxide layer 17 on the surfaces of the device. For example, the oxide layer may be formed by placing the wafer in a suitable oven in an oxygen-rich atmosphere at an elevated temperature, say above 1000° C.

Source and drain zones are formed by predeposition on the portions of the wafer exposed by windows formed in the oxide layer, and then diffusing the predeposited impurities inwardly. In preparation for this step, a photoresist 22 is applied to the oxide layer 17 and thereafter masked, exposed to light, and washed to form windows 23 and 24, FIGURE 4. The wafer is then immersed in a suitable acid etching bath which selectively attacks the oxide layer to remove the exposed portion of the oxide layer to form windows 23' and 24' to expose the surface of the n-type wafer. The wafer is then placed in an atmosphere containing acceptor impurities such as an atmosphere containing boron at a low temperature, around 900° C., whereby a layer of acceptor impurities is predeposited on the exposed surface of the wafer. These impurities serve as a source of atoms for subsequent diffusion inwardly into the n-type wafer to form the source and drain regions. The temperature is then elevated whereby the surface impurities diffuse inwardly to form spaced zones 12 and 13 such as shown in FIGURE 6. During this step an oxide layer is regrown at the windows. The spacing of the windows 23′ and 24′ and the diffusion time control the spacing of the zones. The zones may be caused to overlap or to be spaced a predetermined distance. As will be presently apparent, control of spacing of the zones 12 and 13 serves to determine, in part, the electrical length of the channel.

The channel zone is formed by a subsequent diffusion through a window 27 disposed midway between the diffusion zones 12 and 13. The window may be formed in the manner previously described. Thus, a photoresist 26 is applied and treated to form a window 27, FIGURE 7. A subsequent etching step forms window 27′, FIGURE 8, to expose the wafer.

A predeposition of donor impurities on the surface at the window and a subsequent diffusion and elevation of temperature serve to diffuse impurities inwardly to form the channel zone 14, FIGURE 9. It is to be observed that during this diffusion, the zones 12 and 13 diffuse further and the impurity concentration decreases since no additional atoms are provided at the windows 23′ and 24′. The diffusion of the channel region is relatively short whereby the channel is shallow and has a relatively high impurity concentration.

The gate region is subsequently formed by again employing photoresist techniques to re-open window 27′. A photo-resist 30 is applied and a window 31 larger than window 27 is formed, FIGURE 10, in the manner previously described. An acid etching step re-opens the window 27′. A predeposit of donor impurities is then applied to the surface at the window and a subsequent diffusion will serve to form a gate region 16 having a high impurity concentration. The gate region is registered with the channel since it is diffused through the same window.

By suitably selecting the diffusion times, the channel region 14 may be made as thin as desired. If the initial p-type region is relatively shallow, the subsequent diffusion of the gate region will define a thin channel.

It is also apparent that by control of the diffusion rates, it is possible to have the gate diffusion overtake the channel diffusion and a channel of any desired small thickness can be formed. The diffusion rates may be controlled by either adjustment of the initial surface concentrations of the gate and channel materials to be diffused or, alternatively, impurities having different diffusion rates may be employed. Thus, it is seen that accurate control of the thickness of the channel region and the impurity concentration can be obtained.

The electrical length of the channel region is seen to be determined primarily by the intersection of the channel-substrate junction 19 and the source and drain-substrate junctions, and can be accurately controlled by the spacing of the source and drain regions and the diffusion times. For example, if a relatively short channel is desired, the source and drain regions may be closely spaced whereby upon completion of the diffusions, they are substantially touching. Then a relatively short channel diffusion time is selected whereby the penetration is relatively shallow thereby providing a short channel.

The upper gate junction is preferably made substantially longer whereby it does not control the effective electrical length, the pinch-off taking place at the portion 19 of the channel. Furthermore, the pinch-off will be relatively sharp because the space charge region extends outwardly from a substantially longer length than the abrupt channel and this extension serves to advance as a front and be intercepted by the relatively short portion 19 of the junction 18.

The next step in making a device is to apply a photoresist and open windows through the oxide at the upper and lower surfaces of the wafer for making ohmic connections to the various zones. Preferably, the photoresist is so applied as to form windows which expose an upper portion of the zones and yet do not remove oxide at the surface where the junctions intersect the surface. These steps are shown in FIGURES 13 and 14 where there is shown photoresist applied and having windows 23, 24 and 27, and the windows exposing the wafer, FIGURE 14.

Thus, it is seen that there is provided a field effect device which has a channel region whose electrical length, thickness and impurity concentration are accurately controlled. Moreover, the high impurity concentration provides improved high frequency response.

I claim:

1. A field effect transistor having a source zone coupled to a drain zone through a channel of semiconductor material of one conductivity type which channel is gated by means of a depletion field formed in said channel comprising: a semiconductive wafer of an opposite conductivity type; a source zone composed of material of said one conductivity type comprising a first inset region in said wafer forming a first junction with said wafer material which has a portion substantially parallel to a surface of said wafer and a portion extending upwardly toward said surface; a drain zone composed of material of said one conductivity type comprising a second inset region in said wafer forming a second junction with said wafer material which has a portion substantially parallel to said surface and a portion extending upwardly toward said surface; a channel zone composed of material of said one conductivity type having a high impurity concentration as compared to said source and drain zones comprising an inset region in said wafer which region intersects said upwardly extending junction to form a saddle between said source and drain zones, the lower portion of the saddle extending into said wafer a predetermined distance to define in conjunction with said first and second junctions of said source and drain zones a lower junction of said channel substantially rectilinear and parallel to said surfaces, the length of such lower junction being the effective electrical length of said channel; an upper gate zone formed of material of said opposite conductivity type and juxtaposed with said channel and extending from said surface of said wafer a predetermined distance toward said lower junction of said channel to form the upper junction of said channel and thereby determine the effective electrical thickness of said channel, said gate zone also having a length greater than said lower junction and extending beyond said intersections of said channel zone with said upwardly extending junctions; and back gate means coupled to the other surface of said wafer which in conjunction with said upper gate zone provides said depletion field.

2. A field effect transistor as in claim 1 in which said upper gate zone has a high impurity concentration.

References Cited

UNITED STATES PATENTS

| | | | |
|---|---|---|---|
| 3,183,128 | 5/1965 | Leistiko et al. | 317—235 |
| 3,184,657 | 5/1965 | Moore | 317—234 |
| 3,223,904 | 12/1965 | Warner et al. | 317—235 |
| 3,283,221 | 11/1966 | Heiman | 317—234 X |
| 3,305,913 | 2/1967 | Loro | 29—25.3 |

FOREIGN PATENTS

| | | |
|---|---|---|
| 1,349,963 | 12/1963 | France. |

JOHN W. HUCKERT, *Primary Examiner.*

R. F. POLISSACK, *Assistant Examiner.*